(12) United States Patent
Ooi (10) Patent No.: US 7,752,359 B2
(45) Date of Patent: Jul. 6, 2010

(54) WIRELESS-INTERFACE MODULE AND ELECTRONIC APPARATUS

(75) Inventor: Takuya Ooi, Tokyo (JP)

(73) Assignee: Sony Corporation, Tokyo (JP)

( * ) Notice: Subject to any disclaimer, the term of this patent is extended or adjusted under 35 U.S.C. 154(b) by 397 days.

(21) Appl. No.: 11/562,792

(22) Filed: Nov. 22, 2006

(65) Prior Publication Data

US 2008/0201497 A1   Aug. 21, 2008

(30) Foreign Application Priority Data

Nov. 25, 2005   (JP) .......................... P2005-339905

(51) Int. Cl.
G06F 3/00     (2006.01)
G06F 13/12    (2006.01)
G06F 13/38    (2006.01)
G06F 7/38     (2006.01)
G06F 9/00     (2006.01)
G06F 9/44     (2006.01)

(52) U.S. Cl. ............................ 710/62; 710/8; 712/227
(58) Field of Classification Search ........................ None
See application file for complete search history.

(56) References Cited

U.S. PATENT DOCUMENTS 7,383,478 B1 *   6/2008   Ballagh et al. .............. 714/725
2004/0078179 A1 *  4/2004   Fuji et al. .................... 703/15
2004/0264227 A1 * 12/2004   Kojima et al. ................ 365/45
2006/0139168 A1 *  6/2006   Pratt et al. ............. 340/539.22

FOREIGN PATENT DOCUMENTS

| EP | 1189070 | 9/1984 |
| JP | 8-114647 | 5/1996 |
| JP | 2005-020349 | 1/2005 |
| JP | 2005-249781 | 9/2009 |

OTHER PUBLICATIONS

Japanese Office Action for corresponding JP2005-339905 dated Feb. 16, 2010.

* cited by examiner

Primary Examiner—Henry W. H. Tsai
Assistant Examiner—Kris Rhu
(74) Attorney, Agent, or Firm—K&L Gates LLP (57) ABSTRACT

A wireless-interface module is provided. The wireless-interface module includes a connection unit connected to a standardized connection-terminal unit of a semiconductor device, the semiconductor device having a function of performing internal processing on the basis of a predetermined signal input from the standardized connection-terminal unit. The wireless-interface module also includes a wireless signal-transmission-and-reception unit that transmits and/or receives a wireless signal to and/or from a wireless-interface module provided on the host-device side, where the host device makes the semiconductor device execute internal processing, and a control unit that controls an operation performed by the wireless signal-transmission-and-reception unit and that converts a signal transmitted and/or received between the connection unit and the wireless signal-transmission-and-reception unit.

34 Claims, 11 Drawing Sheets

| SIGNAL LINES OF TAP | FUNCTION |
|---|---|
| TDI (Test Data In) | SIGNAL THAT IS USED FOR SERIALLY INPUTTING COMMAND AND/OR DATA TO TEST LOGIC AND THAT IS SAMPLED AT TCK RISING EDGE |
| TDO (Test Data Out) | SIGNAL THAT IS USED FOR SERIALLY OUTPUTTING DATA FROM TEST LOGIC AND OUTPUT VALUE OF TDO IS CHANGED AT TCK FALLING EDGE |
| TCK (Test Clock) | PURPOSE-BUILT INPUT THAT ALLOWS FOR SUPPLYING CLOCK TO TEST LOGIC AND THAT ALLOWS FOR USING SERIAL-TEST-DATA PATH INDEPENDENTLY OF SYSTEM CLOCK INHERENT IN COMPONENT |
| TMS (Test Mode Select) | SIGNAL CONTROLLING TEST OPERATION, THE SIGNAL BEING SAMPLED AT TCK-RISING EDGE AND DECODED BY TAP CONTROLLER |
| TRST (Test ReSeT) | NEGATIVE-LOGIC SIGNAL THAT INITIALIZES TAP CONTROLLER ASYNCHRONOUSLY AND THAT IS AVAILABLE AS OPTION. THIS STATE IS ALSO ACHIEVED WHEN TMS IS IN "H" STATE AND TCK-RISING EDGE IS DETECTED FIVE TIMES. |

WIRELESS-INTERFACE MODULE AND ELECTRONIC APPARATUS

CROSS REFERENCES TO RELATED APPLICATIONS

The present application claims priority to Japanese Patent Application JP 2005-339905 filed in the Japanese Patent Office on Nov. 25, 2005, the entire contents of which are incorporated herein by reference.

BACKGROUND

The present disclosure relates to a wireless-interface module and an electronic apparatus that allow for easily performing internal processing such as debugging of a semiconductor device having a standardized interface.

In the past, while developing and designing the software and hardware of an electronic-circuit substrate including a plurality of large-scale integrated (LSI) circuits, a Joint-Test-Action-Group (JTAG) connector and/or other serial connectors were prepared for a designer to perform debugging of the software and get information about the internal state of the hardware. Namely, the above-described connector was connected to a personal computer (PC) for verification via a dedicated converter, so as to debug and/or verify the hardware and/or the software. The above-described technology is disclosed in Japanese Unexamined Patent Application Publication No. 8-114647, for example.

Figure 14A:
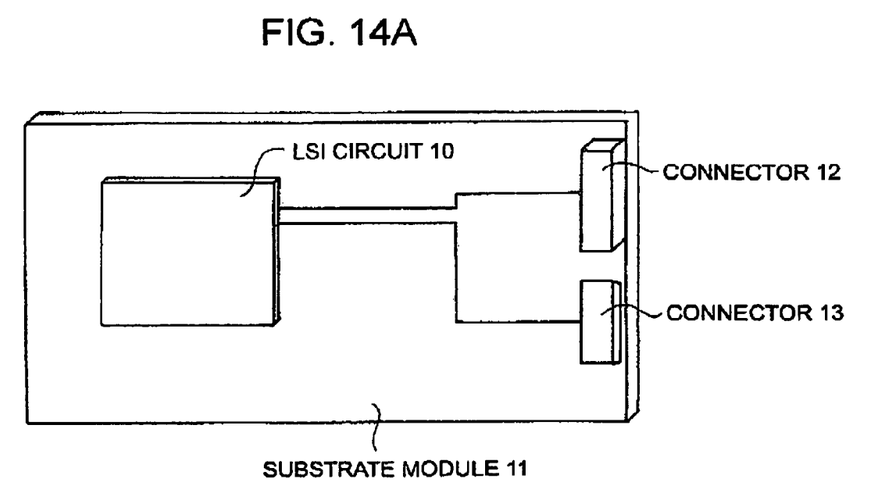
FIG. 14A is a block diagram showing the case where an LSI circuit is tested according to a known method.
Figure 14B:
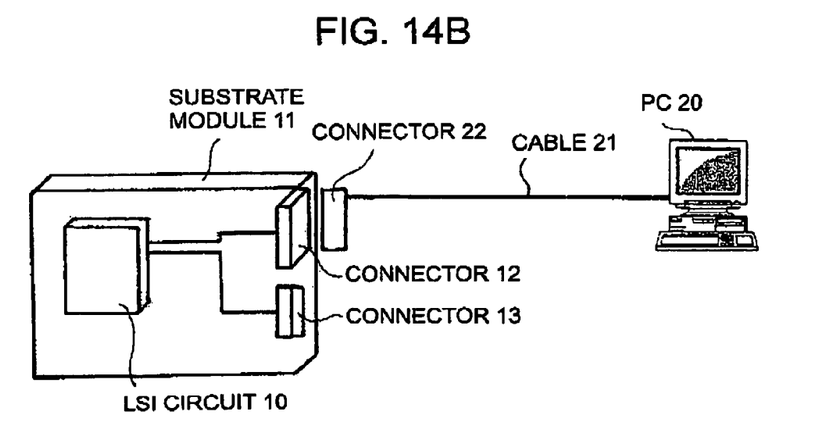
FIG. 14B is another block diagram showing the case where the LSI circuit is tested according to the known method.

Each of FIGS. 14A and 14B is a block diagram showing the example where the LSI circuit is tested according to a known method.

First, FIG. 14A shows a substrate module 11 on which an LSI circuit to be tested (hereinafter referred to as a target LSI circuit) 10 is mounted. As shown in FIG. 14A, two types of connectors 12 and 13 connected to the target LSI circuit 10 are provided on the substrate module 11. The connector 12 supports a JTAG system and includes an Institute-of-Electrical-and-Electronics-Engineers (IEEE) 1149.1. The connector 13 is a general-purpose serial interface including a Recommended Standard 232 version C (RS-232C), a universal serial bus (USB), an IEEE 1394, and so forth.

FIG. 14B shows the example where a PC for debugging (host device) 20 performs debugging of the target LSI circuit 10. As shown in FIG. 14B, a connector 22 of the PC 20 is connected to a connector (the JTAG connector 12 in FIG. 14B) of the target LSI circuit 10 via a debugging cable 21. A predetermined signal is output from the connector 22 so that debugging is performed for the target-LSI-circuit-10 side.

Thus, wiring for debugging and connectors are required to perform the above-described processing. As the number of target LSI circuits increases, the wiring used for debugging becomes more complicated. Further, when serial debugging is performed, a predetermined number of connectors need to be added, as necessary, or it becomes necessary to switch among the wiring by using a switch integrated circuit (IC).

Recently, the capability of electrical products has been significantly increased. Further, the competition to decrease commodity prices has become fierce, and reduction of the commodity cycle has become significant.

On the other hand, when the product designing is actually performed, a substrate for design verification needs to be designed and/or mounted independently of a product substrate, where the substrate for design verification includes an interface (I/F) for debugging such as a Joint-Test-Action-Group (JTAG) device. Subsequently, the cost of product development is increased and the efficiency of product designing is decreased.

When the number of large-scale integrated (LSI) circuits mounted on the substrate increases, as is the case with the above-described configuration, the number of I/Fs for debugging is increased so that wiring provided for the I/Fs for debugging becomes complicated. Further, the design time and/or the mounting cost is increased, and verification processing is complicated.

Therefore, when debugging or the like is performed according to the above-described known method, it becomes difficult to efficiently adapt to the increased capability of electrical products, the fierce competition to decrease the commodity prices, and the commodity-cycle reduction or the like with regard to cost and/or speed.

SUMMARY

The present disclosure provides a wireless-interface module and an electronic apparatus that allow a host device to easily make a semiconductor device such as a target LSI circuit perform internal processing such as debugging and that increase the operability of the semiconductor device.

Accordingly, a wireless-interface module according to an embodiment includes a connection unit connected to a standardized connection-terminal unit of a semiconductor device having a function of performing internal processing on the basis of a predetermined signal input from the standardized connection-terminal unit, a wireless signal-transmission-and-reception unit that transmits and/or receives a wireless signal to and/or from a wireless-interface module provided on the host-device side, where the host device makes the semiconductor device execute internal processing, and a control unit that controls an operation performed by the wireless signal-transmission-and-reception unit and that converts a signal transmitted and/or received between the connection unit and the wireless signal-transmission-and-reception unit.

A wireless-interface module according to another embodiment includes a connection unit connected to a standardized connection-terminal unit of a host device that uses a predetermined signal output from the connection-terminal unit so that internal processing of a semiconductor device is performed, a wireless signal-transmission-and-reception unit that transmits and/or receives a wireless signal to and/or from a wireless-interface module provided on the semiconductor-device side, and a control unit that controls an operation performed by the wireless signal-transmission-and-reception unit and that converts a signal transmitted and/or received between the connection unit and the wireless signal-transmission-and-reception unit.

An electronic apparatus according to another embodiment includes a semiconductor device having a function of performing internal processing on the basis of a predetermined signal input from a standardized connection-terminal unit, and a wireless-interface module interfacing between a wireless-interface module provided on the host-device side, the host device making the semiconductor device perform the internal processing, and the semiconductor device. The wireless-interface module includes a connection unit connected to the standardized connection-terminal unit of the semiconductor device, a wireless signal-transmission-and-reception unit that transmits and/or receives a wireless signal to and/or from the wireless-interface module provided on the host-device side, and a control unit that controls an operation performed by the wireless signal-transmission-and-reception unit and that converts a signal transmitted and/or received between the connection unit and the wireless signal-transmission-and-reception unit.

An electronic apparatus according to another embodiment includes a host device that uses a predetermined signal output from a standardized connection-terminal unit so that internal processing of a semiconductor device is performed, and a wireless-interface module interfacing between a wireless-interface module provided on the semiconductor-device side and the host device. The wireless-interface module includes a connection unit connected to the standardized connection-terminal unit of the host device, a wireless signal-transmission-and-reception unit that transmits and/or receives a wireless signal to and/or from the wireless-interface module provided on the semiconductor-device side, and a control unit that controls an operation performed by the wireless signal-transmission-and-reception unit and that converts a signal transmitted and/or received between the connection unit and the wireless signal-transmission-and-reception unit.

A wireless-interface module and an electronic apparatus according to an embodiment allow for performing wireless communications between a host device and the semiconductor-device side via the wireless-interface module and performing internal processing of the semiconductor device. Subsequently, it becomes possible to perform processing such as debugging without performing wired connector connection which was performed in the past. Further, the operability is significantly increased when compared to that in the past, and processing including tests on the semiconductor device, updating programs, and so forth can be easily performed in a non-contact manner. Since the above-described processing can be performed in the non-contact manner, the above-described wireless-interface module and electronic apparatus can be used, so as to test an apparatus on which a semiconductor device is mounted after the apparatus is assembled, for example. Thus, the above-described wireless-interface module and electronic apparatus can provide a useful system.

Additional features and advantages are described herein, and will be apparent from, the following Detailed Description and the figures.

DETAILED DESCRIPTION

According to an embodiment, a wireless-interface module is mounted on a target large-scale integrated (LSI) circuit (a semiconductor device), and used, as an interface for debugging. For example, a low-power-consumption communication module using a reflected wave within 2.4 GHz band is used, as the above-described wireless-interface module.

Reflected-wave communications (back-scatter system) are performed, for an RF tag. When the reflected-wave communications are performed, so as to transmit data, the data is transmitted by reflecting a carrier wave generated by an external-reflected-wave reader. Therefore, a data-transmission power amplifier (PA) or the like may not be provided in a transmission module so that the transmission module becomes very small in size and capable of operating with low power consumption. Therefore, a communication module such as the above-described communication module is mounted and integrated with top part of an LSI circuit using an ordinary complementary metal-oxide-semiconductor (CMOS) technology, and connected to pins of the LSI circuit. Subsequently, the communication module can be driven appropriately by power output from the LSI circuit. The configuration of mounting the communication module can be changed in various ways, as will be described later.

In the past, debugging verification was performed by using a dedicated external interface and a connector. However, according to the above-described embodiment, the debugging verification can be wirelessly achieved via the wireless-interface module. Further, under certain circumstances, the debugging verification or the like can be achieved even though the target LSI circuit is accommodated in a cabinet.

FIGS. 1A, 1B, 2, and 3 are block diagrams showing three example substrate modules of a target LSI circuit according to an embodiment.

Figure 1A:
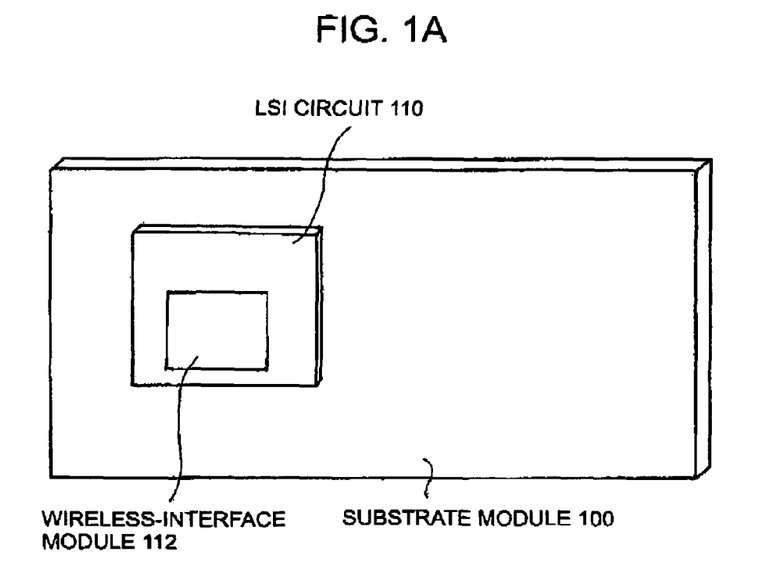
FIG. 1A is a block diagram showing a first example substrate module of a target LSI circuit according to an embodiment.

FIG. 1A shows the example where a wireless-interface module (Back Scatter) 112 is mounted onto top part of a target LSI circuit 110 mounted onto a substrate module 100. The target LSI circuit 110 and the wireless-interface module 112 are directly connected to each other through die bonding and/or wire bonding.

Thus, the wireless-interface module 112 is provided on a top surface of the target LSI circuit 110, which allows for providing the interface without increasing placement space of the substrate module 100.

Figure 1B:
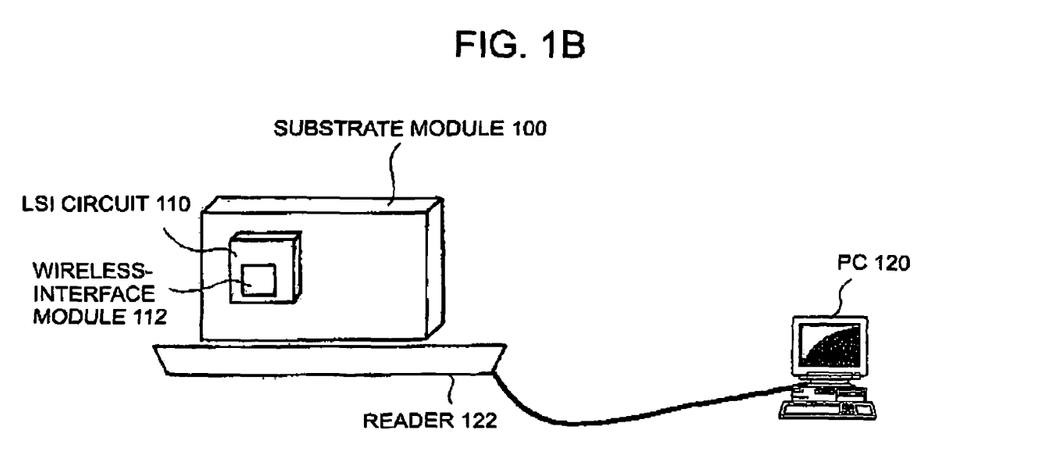
FIG. 1B is another block diagram showing the first example substrate module of the target LSI circuit.

FIG. 1B shows the example where the substrate module 100 is tested by using a PC for debugging (host device) 120 (hereinafter referred to as the debugging PC 120). The debugging PC 120 has a reader 122 including the same wireless-interface module as the wireless-interface module 112 provided on the target-LSI-circuit-110 side. When the substrate module 100 is provided on the reader 122, it becomes possible to access from the debugging PC 120 by performing predetermined processing procedures. Subsequently, verification of the program, configuration, resistor read and/or write (R/W) status of an LSI chip, debugging the LSI chip, monitoring the state of the LSI chip, and so forth can be performed in a non-contact manner.

Figure 2:
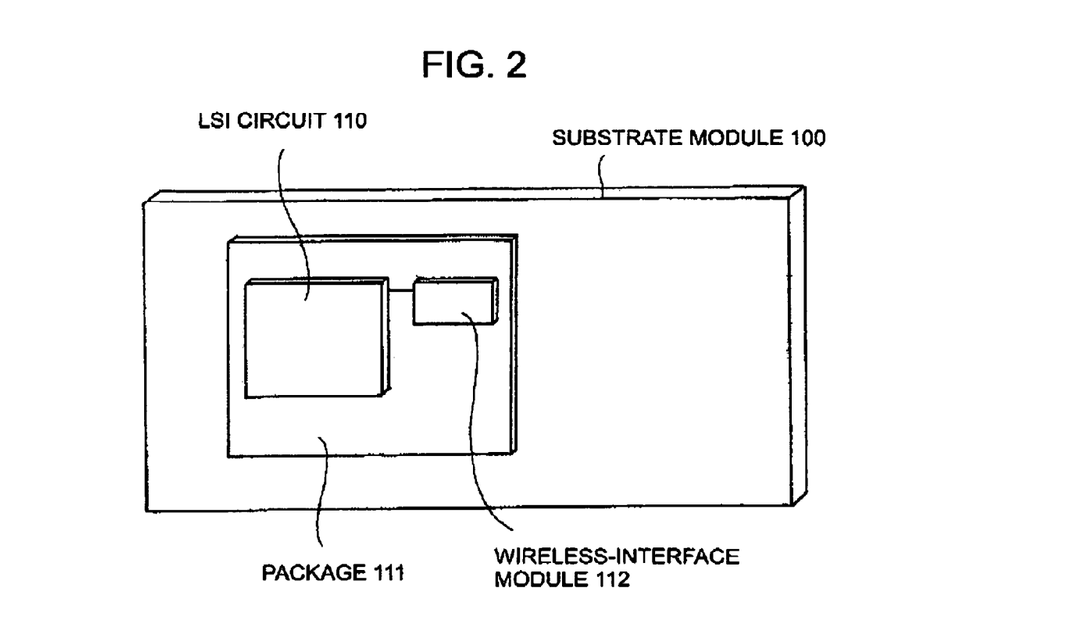
FIG. 2 is a block diagram showing a second example substrate module of the target LSI circuit.

FIG. 2 shows the example where the wireless-interface module 112 is provided in a package 111 of the target LSI circuit 110 and connected to the target LSI circuit 110 so that a multichip module is achieved.

Figure 3:
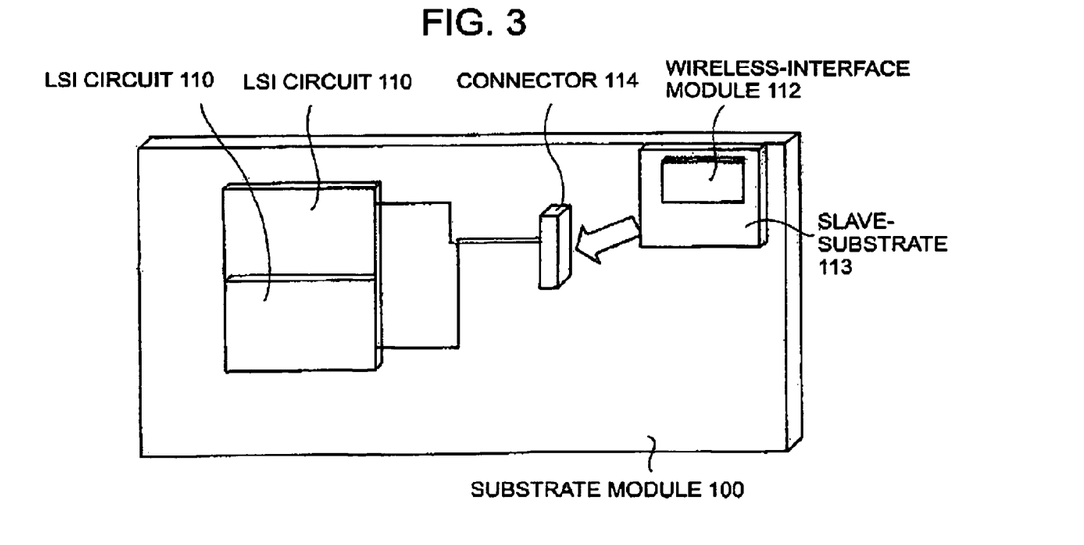
FIG. 3 is a block diagram showing a third example substrate module of the target LSI circuit.

Further, FIG. 3 shows the example where a plurality of the target LSI circuits 110 are provided in the substrate module 100 and the single wireless-interface module 112 is provided on the slave-substrate-113 side. Each of the target LSI circuits 110 and the wireless-interface module 112 are connected to each other via a connector 114.

According to the above-described embodiment, reflected-wave communications (according to a back-scatter system) are performed for the wireless-interface module. However, other low-power wireless communications such as Bluetooth can be performed for the wireless-interface module. Further, infrared communications can be performed for the wireless-interface module.

Further, the signal format of the interface can be changed without being limited to that supporting Joint Test Action Group (JTAG) system. Namely, the signal format can be changed to those supporting other general-purpose serial interfaces including a recommended standard 232 version C (RS-232C), a universal serial bus (USB), an Institute-of-Electrical-and-Electronics-Engineers (IEEE) 1149.1, and so forth.

Hereinafter, a plurality of example specific configurations of a wireless-interface module according to another embodiment is described.

Figure 4:
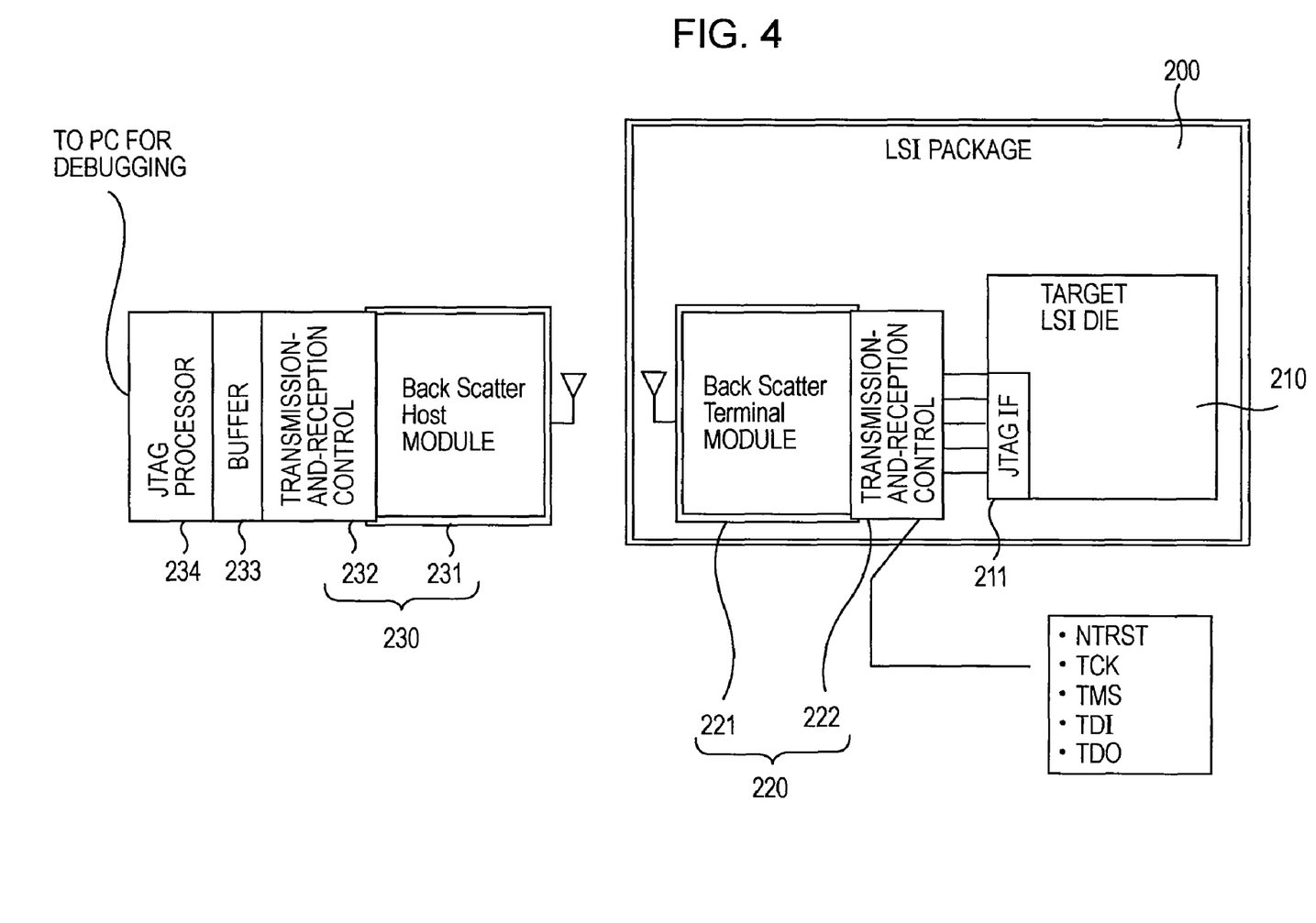
FIG. 4 is a block diagram showing an example specific configuration where a JTAG system and reflected-wave communications are adopted.

FIG. 4 is a block diagram showing an example configuration wherein the JTAG system and the reflected-wave communications are used.

As shown in FIG. 4, a target LSI circuit 210 and a wireless-interface module 220 are provided in an LSI package 200. The wireless-interface module 220 includes a communication module 221 and a transmission-and-reception control unit 222.

The transmission-and-reception control unit 222 includes a connection unit connected to a JTAG terminal of the target LSI circuit 210, a signal-processing unit performing signal processing or the like necessary to perform wireless communications, a communication-control unit controlling operations of the communication module 221, and so forth.

The communication module 221 transmits and/or receives data to and/or from an opposite-party communication module by performing the above-described reflected-wave communications. In FIG. 4, signals n test reset (NTRST), test clock (TCK), test mode select (TMS), test data input (TDI), and test data output (TDO) are transmitted and/or received between the communication module 221 and the JTAG terminal 211 of the target LSI circuit 210.

According to the JTAG system, a serial interface inputting and/or outputting an instruction for a test logic, test data, data on a result of the test, and so forth is referred to as a test-access port (TAP). The TAP has five signal lines, as shown in FIG. 4. The signal lines are externally controlled so that a JTAG test is performed.

Figure 5:
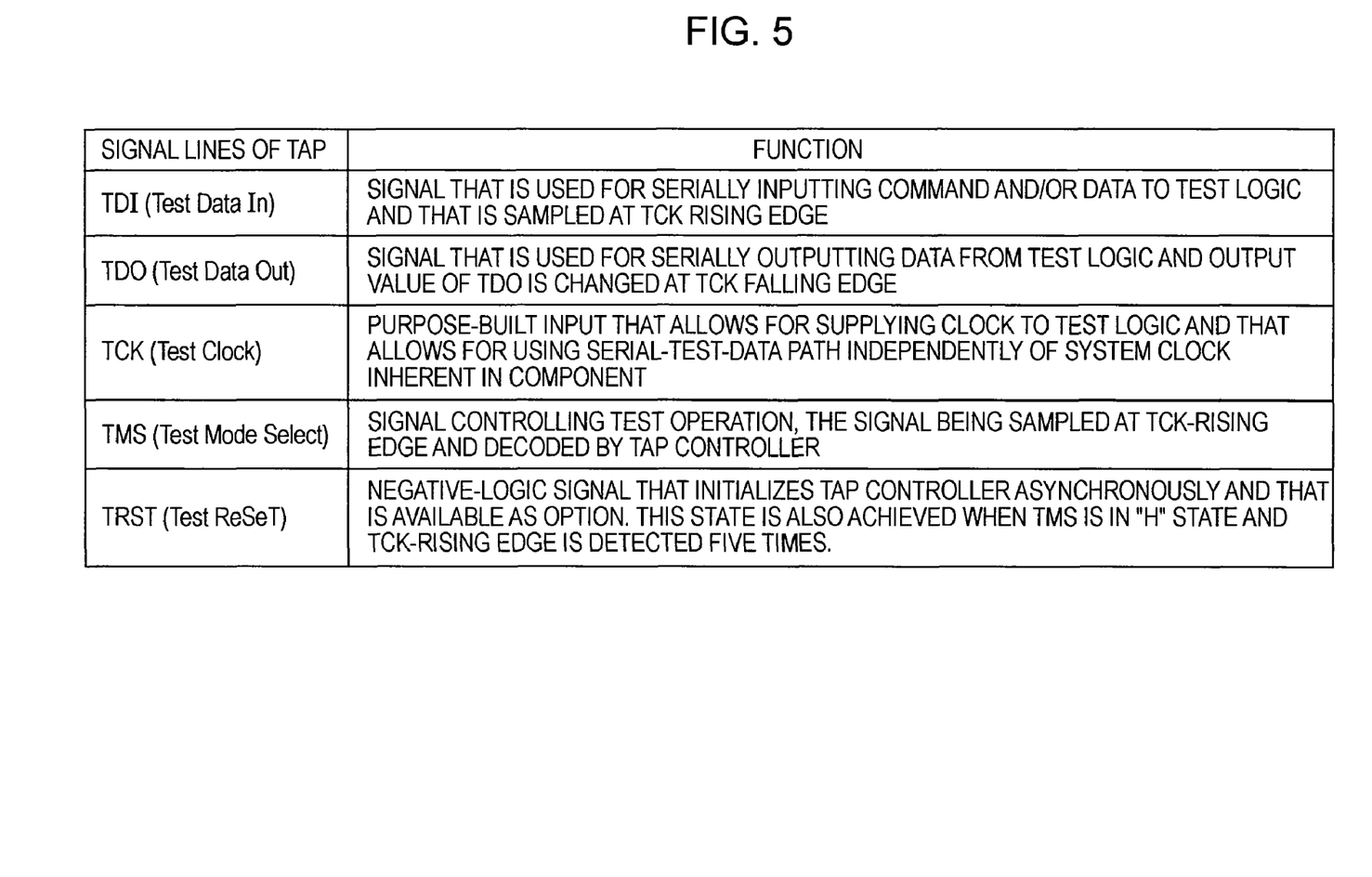
FIG. 5 illustrates signal lines of a TAP and part of functions of the signal lines.

FIG. 5 shows the type and function of each of the signal lines of the TAP.

On the debugging-PC side, a wireless-interface module 230 which is the same as that provided on the target-LSI-circuit-210 side is provided. The wireless-interface module 230 also has a communication module 231 and a transmission-and-reception control unit 232. The transmission-and-reception control unit 232 is connected to a JTAG processor 234 via a buffer 233.

The JTAG processor 234 performs code conversion or the like adhering to the JTAG system according to an instruction transmitted from the debugging PC 120 and controlling processing such as debugging for the target-LSI-circuit-210 side.

The above-described configuration allows for debugging the target LSI circuit 210, for example, in a non-contact manner via the wireless-interface modules 220 and 230.

Figure 6:
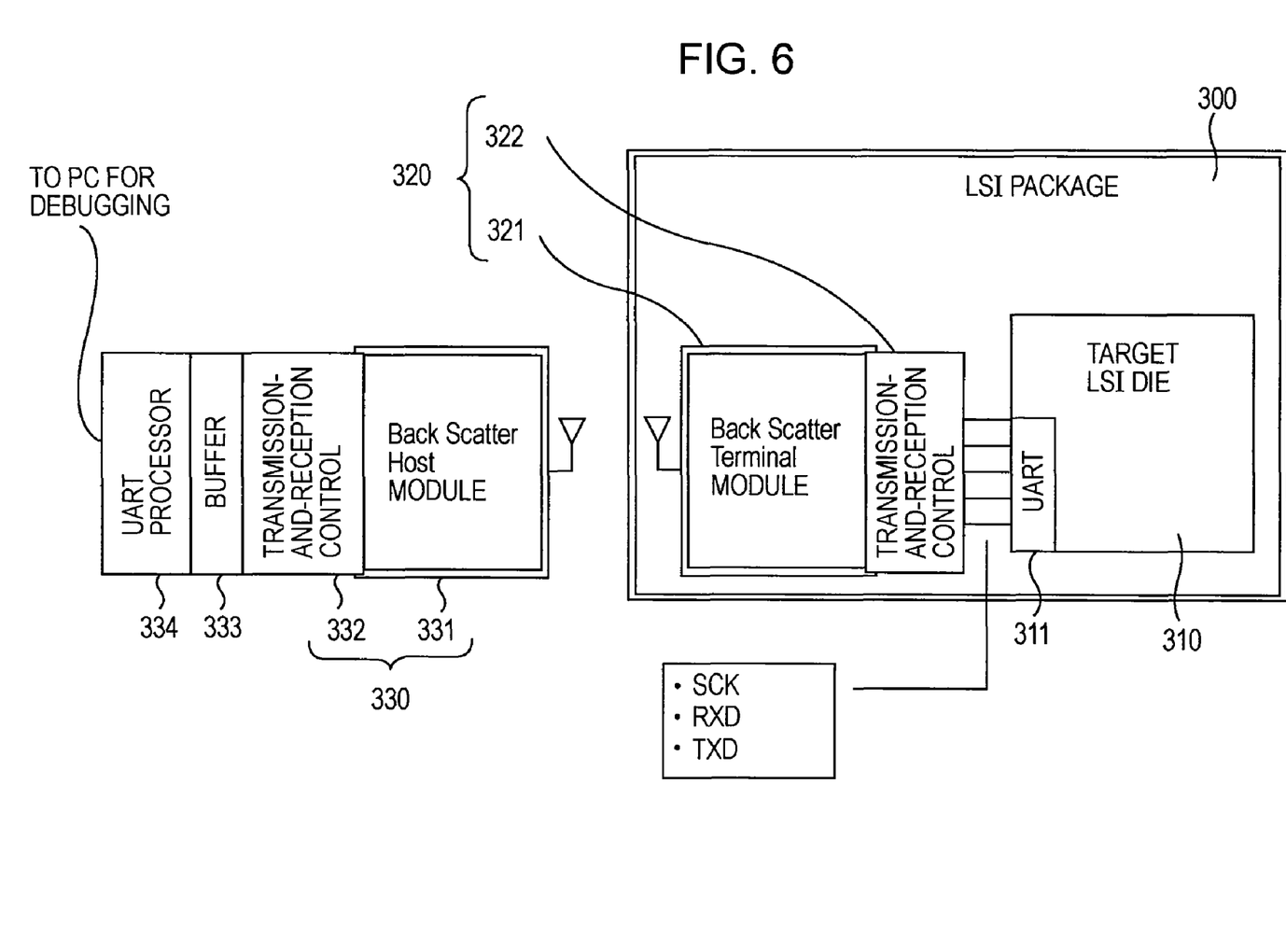
FIG. 6 is a block diagram showing an example configuration wherein an RS-232C and reflected-wave communications are adopted.

FIG. 6 is a block diagram showing an example configuration wherein the RS-232C and the reflected-wave communications are adopted.

FIG. 6 shows an example where a universal-asynchronous-receiver-transmitter (UART) function of the target LSI circuit is used. The UART function allows for converting a transmitted serial signal into a parallel signal and converting data which is to be transmitted from the target LSI circuit to a peripheral device from the parallel signal into the serial signal.

According to the above-described embodiment, a target LSI circuit 310 and a wireless-interface module 320 are provided in an LSI package 300. The wireless-interface module 320 includes a communication module 321 and a transmission-and-reception control unit 322. The transmission-and-reception control unit 322 performs serial communications between itself and a UART terminal 311 of the target LSI circuit 310 under the RS-232C or the like so that a synchronous signal SCK, reception data RXD, and transmission data TXD are transmitted and/or received between the transmission-and-reception control unit 322 and the UART terminal 311.

On the debugging-PC side, a wireless-interface module 330 including a communication module 331 and a transmission-and-reception control unit 332, a buffer 333, and a UART processor 334 are provided. Since the configuration on the debugging-PC side is the same as that shown in FIG. 4, the description thereof is omitted.

According to the above-described configuration, debugging the target LSI circuit 310 can be performed, for example, in a non-contact manner via the wireless interface modules 320 and 330.

Next, specific example configurations of the wireless-interface modules will be described.

Figure 7:
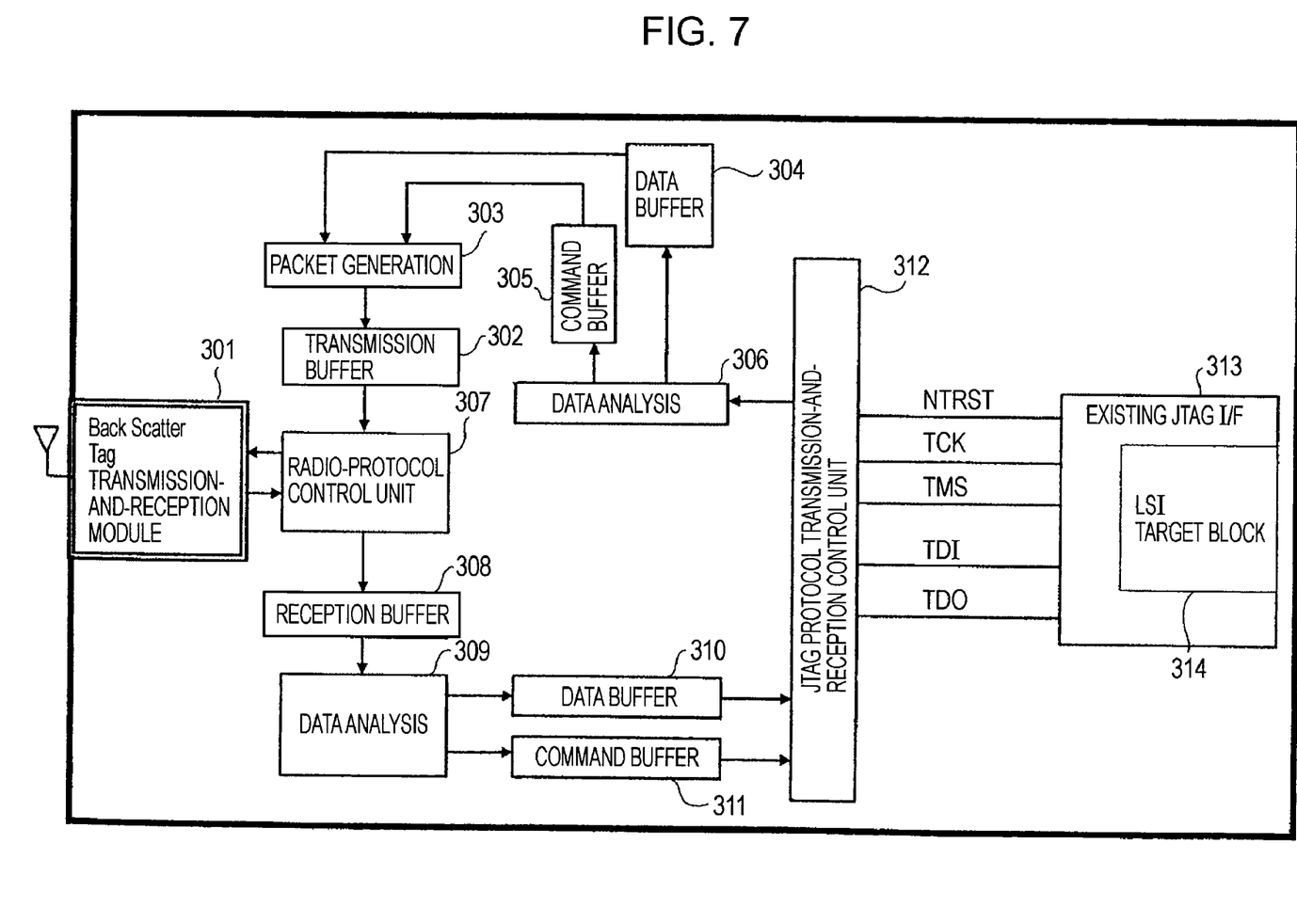
FIG. 7 is a block diagram showing details on the target-LSI side shown in FIG. 4.
Figure 8:
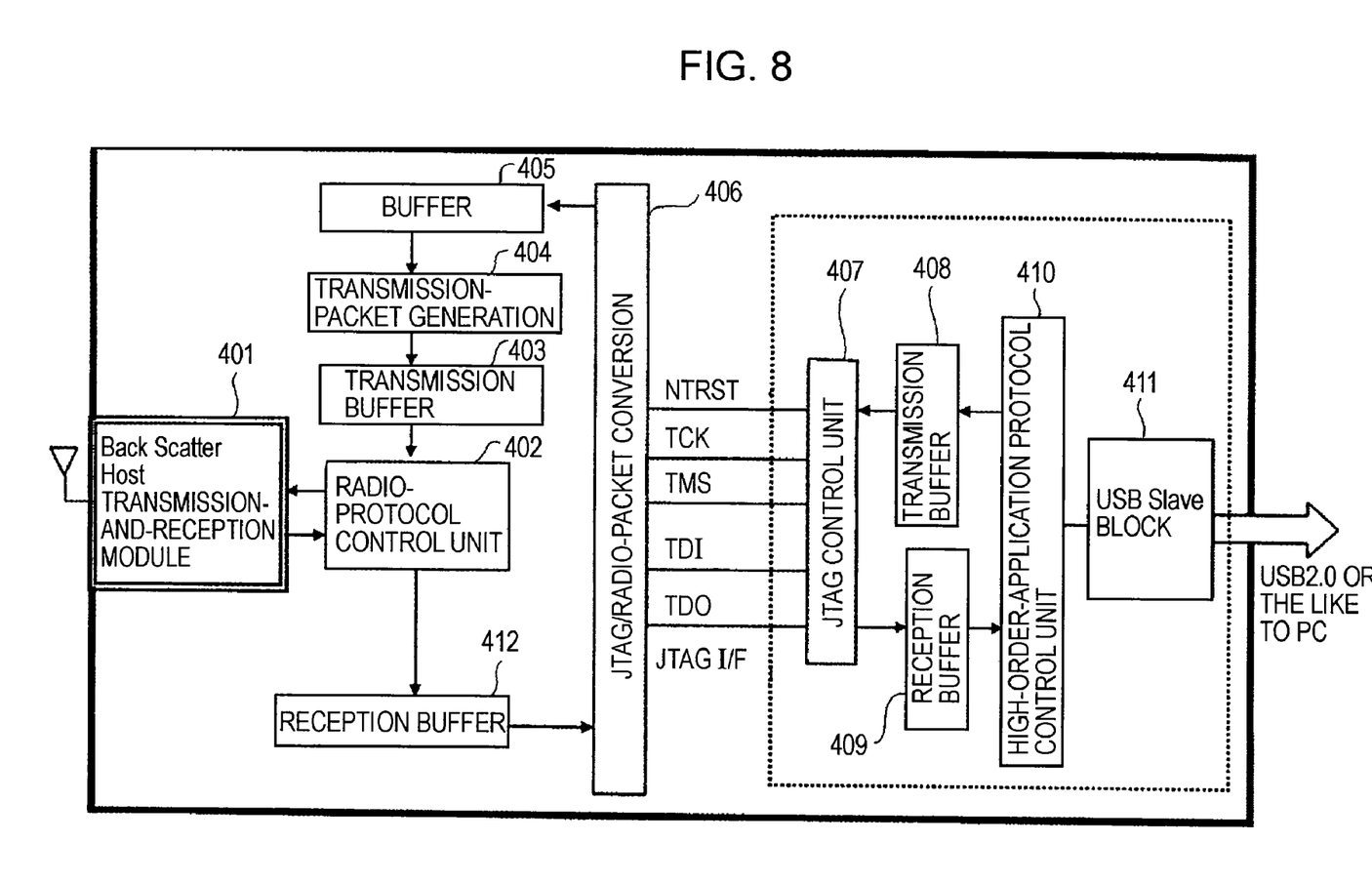
FIG. 8 is a block diagram showing details on the debugging-PC side shown in FIG. 4.

Each of example configurations shown in FIGS. 7 and 8 corresponds to the example shown in FIG. 4. FIG. 7 shows the example configuration of the wireless-interface module provided on the target-LSI-circuit side and FIG. 8 shows the example configuration of the wireless-interface module provided on the PC side.

As shown in FIG. 7, the wireless-interface module provided on the target-LSI-circuit side includes a reflected-wave-communication module 301, a transmission buffer 302, a transmission-packet-generation unit 303, a data buffer 304, a command buffer 305, a reception-data-analysis unit 306, a wireless-protocol-control unit 307, a reception buffer 308, a data-analysis unit 309, a data buffer 310, a command buffer 311, and a transmission-and-reception control unit 312.

Further, a JTAG interface 313 including a JTAG terminal is provided in a target LSI circuit 314.

The transmission buffer 302 includes a wireless-transmission packet. The transmission-packet-generation unit 303 receives data transmitted from the data buffer 304 and the command buffer 305, and generates a wireless-transmission packet. The command buffer 305 stores a JTAG command and the data buffer 304 stores data associated with the JTAG command.

The data-analysis unit 306 analyzes the JTAG command transmitted from the target-LSI-circuit side per instruction, separates the JTAG command into data and a command unit, and stores the data and the command unit in each of the data buffer 304 and the command buffer 305.

The wireless-protocol-control unit 307 accesses the transmission module 301, the transmission buffer 302, and the reception buffer 308, and performs wireless communications between itself and the PC side.

The reception buffer 308 stores a wireless-reception packet transmitted from the reflected-wave-communication module 301. The data-analysis unit 309 generates a JTAG command by analyzing the wireless-reception packet received by the reception buffer 308 and stores the JTAG command and data associated with the JTAG command in the buffers 310 and 311.

The transmission-and-reception control unit 312 includes a JTAG-protocol-control unit, stores the JTAG command transmitted from the target-LSI circuit in the data-analysis unit 306, acquires the JTAG command from the data stored in the buffers 310 and 311, and transmits the JTAG command to the target-LSI-circuit side.

As shown in FIG. 8, the wireless-interface module provided on the PC side includes a reflected-wave-communication module 401, a wireless-protocol-control unit 402, a transmission buffer 403, a transmission-packet-generation unit 404, a buffer 405, a packet-conversion unit 406, and a reception buffer 412.

A JTAG processor provided between the wireless-interface module and the PC includes a JTAG-control unit 407, a transmission buffer 408, a reception buffer 409, a protocol-control unit 410, and a USB transmission-and-reception block 411. The JTAG processor has the same configuration as that of a known JTAG processor.

The wireless-protocol-control unit 402 accesses the communication module 401, the transmission buffer 403, and the reception buffer 412, so as to perform wireless communications between itself and the target-LSI-circuit side. The transmission buffer 403 stores a wireless-transmission packet and the transmission-packet-generation unit 404 compiles the JTAG data stored in the buffer 405 into a wireless packet by command. Further, the transmission-packet-generation unit 404 gives a header to the wireless packet. Thus, the wireless packet is generated.

The packet-conversion unit 406 converts the wireless-reception packet transmitted from the target-LSI-circuit side into a JTAG command. Further, the packet-conversion unit 406 stores the JTAG command transmitted from the PC side in the buffer 405 for performing the packet conversion.

The JTAG-control unit 407 is provided, so as to control JTAG protocols. The JTAG-control unit 407 acquires the JTAG command from the data stored in the transmission buffer 408, transmits the JTAG command, and stores JTAG-reception data in the reception buffer 409. The transmission buffer 408 is a buffer storing a transmission JTAG command and the reception buffer 409 is a buffer storing a reception-JTAG command.

The protocol-control unit 410 is a protocol-control unit used for a high-order application. The protocol-control unit 410 converts a command transmitted from an application of the PC into the JTAG command via the USB transmission-and-reception block 411, stores the JTAG command in the transmission buffer 408, converts the reception-JTAG command stored in the reception buffer 409 into an application command, and transmits the application command to the PC via the USB transmission-and-reception block 411.

Figure 9:
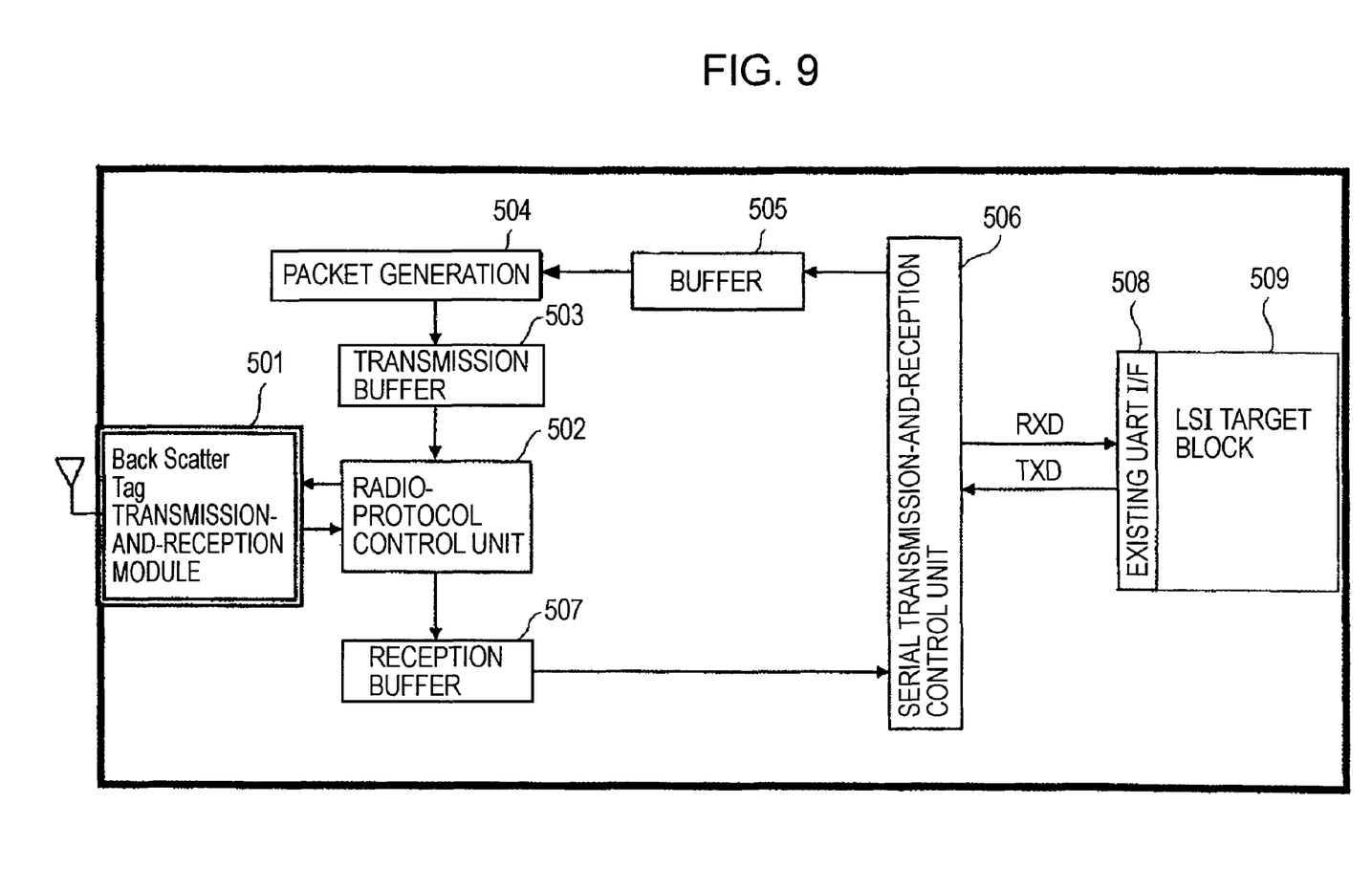
FIG. 9 is a block diagram showing details on the target-LSI side shown in FIG. 6.
Figure 10:
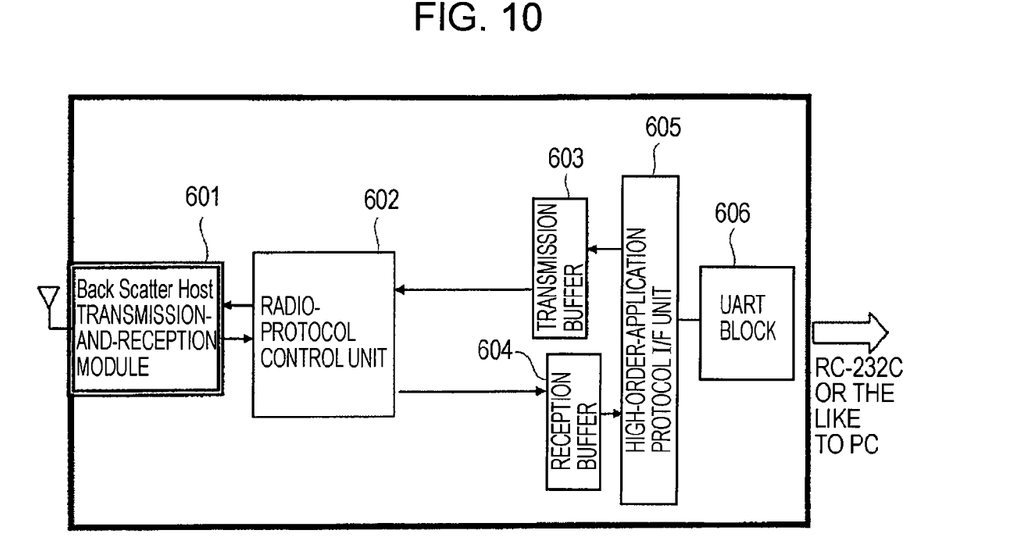
FIG. 10 is a block diagram showing details on the debugging-PC side shown in FIG. 6.

Each of the example configurations shown in FIGS. 9 and 10 correspond to the example shown in FIG. 6. FIG. 9 shows the example configuration of the target-LSI-circuit side and FIG. 10 shows the example configuration of the PC side.

As shown in FIG. 9, the wireless-interface module provided on the target-LSI-circuit side includes a reflected-wave-communication module 501, a wireless-protocol-control unit 502, a transmission buffer 503, a transmission-packet-generation unit 504, a data buffer 505, a serial transmission-and-reception control unit 506, and a reception buffer 507.

Further, a UART interface 508 including a UART terminal is provided in a target LSI circuit 509.

The wireless-protocol-control unit 502 accesses the communication module 501, the transmission buffer 503, and the reception buffer 507, so as to perform wireless communications between itself and the PC side.

The transmission buffer 503 stores a wireless-transmission packet and the transmission-packet-generation unit 504 compiles serial data stored in the data buffer 505 to a wireless-packet size and gives a header to the compiled serial data so that a wireless packet is generated.

The serial-transmission-and-reception control unit 506 stores transmission data transmitted from the target-LSI-circuit side in the data buffer 505 and acquires reception data transmitted from the PC side from the reception buffer 507 and serially transfers the acquired reception data to the target-LSI-circuit side.

As shown in FIG. 10, the wireless-interface module provided on the PC side includes a reflected-wave-communication module 601 and a wireless-protocol-control unit 602. A transmission buffer 603, a reception buffer 604, a protocol-interface unit 605, and a UART block 606 are provided on the UART-processor side.

The wireless-protocol-control unit 602 accesses the reflected-wave-communication module 601, the transmission buffer 603, and the reception buffer 604, and performs wireless communications between itself and a target LSI circuit.

The protocol-interface unit 605 compiles serial data transmitted from the PC side into a wireless packet and gives a header to the wireless packet so that a wireless-transmission packet is generated. Then, the protocol-interface unit 605 stores the wireless-transmission packet in the transmission buffer 603, cuts serial data from a wireless-reception packet stored in the reception buffer 604, and transmits the serial data to the PC side via the UART block 606 by the RS-232C or the like.

According to another embodiment, a wireless-interface module is provided on an electronic apparatus (substrate) on which a plurality of target LSI circuits are mounted.

Figure 11:
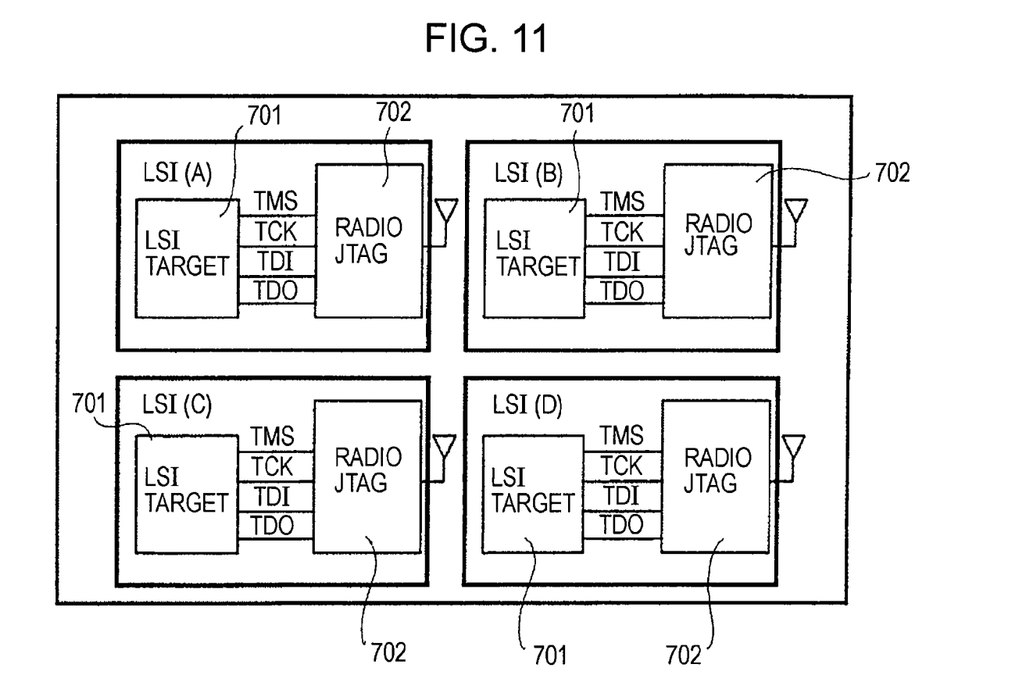
FIG. 11 is a block diagram showing a first example of providing a plurality of wireless-interface modules.

FIG. 11 shows an example where a wireless-interface module 702 is provided on each of a plurality of target LSI circuits 701. Each of the wireless-interface modules 702 is identified by an identification code or the like. Further, each of the wireless-interface modules 702 performs predetermined processing such as debugging according to an instruction transmitted from the PC.

According to the embodiment shown in FIG. 11, the plurality of target LSI circuits 701 supports the JTAG system. However, LSI circuits supporting other serial-communication systems can be used, as the target LSI circuit 701.

Figure 12:
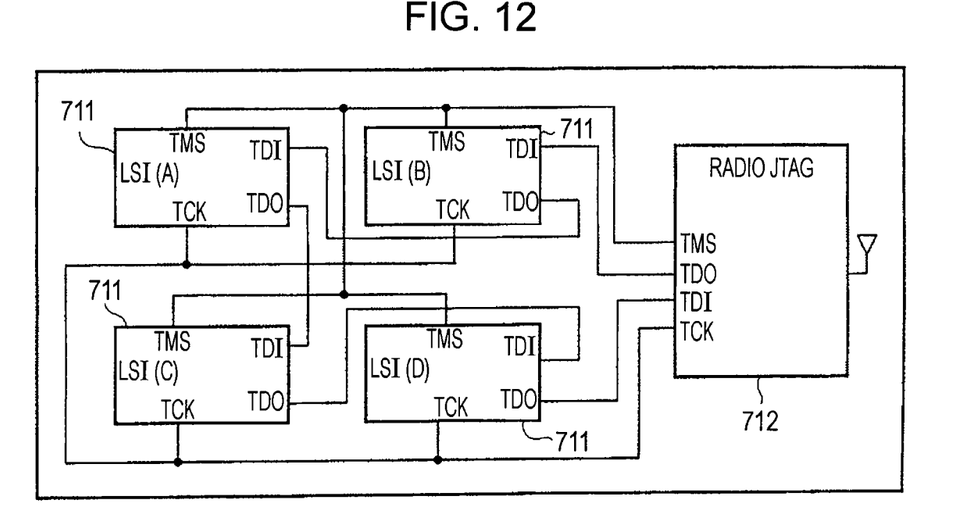
FIG. 12 is a block diagram showing a second example of providing a wireless-interface module.

FIG. 12 shows the example where a single wireless-interface module 712 is provided for a plurality of LSI circuits 711 supporting the JTAG system. Terminals TSM and TCK of the wireless-interface module 712 are connected in parallel to the LSI circuit 711 supporting the JTAG system. Further, terminals TDI and TDO are connected to the LSI circuits 711 in a daisy-chain manner so that the LSI circuits 711 supporting the JTAG system are accessed in sequence.

Figure 13:
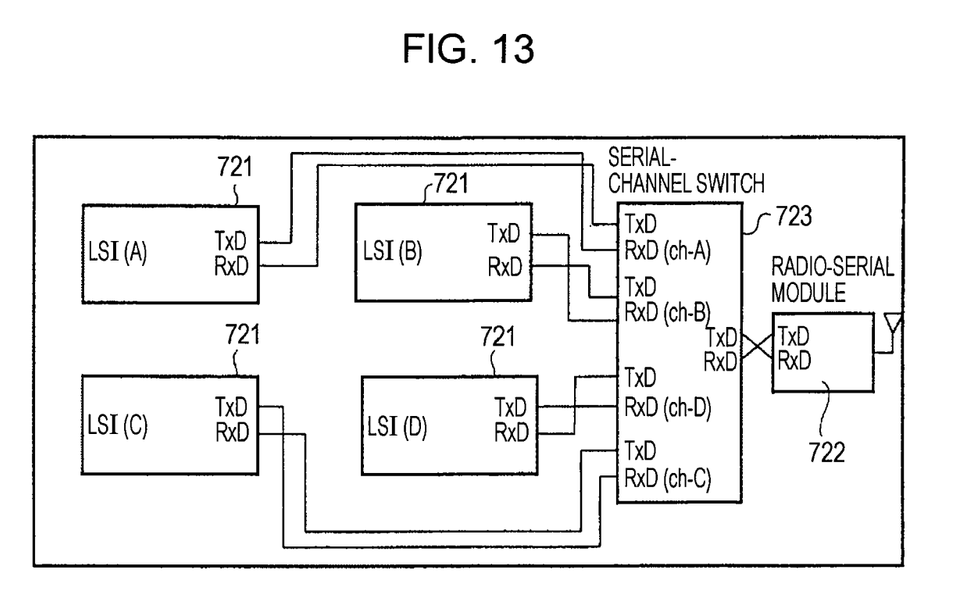
FIG. 13 is a block diagram showing a third example of providing a wireless-interface module.

Further, FIG. 13 shows the example where a plurality of LSI circuits 721 supporting serial communications and a single wireless-interface module 722 are provided. A serial-channel switch 723 is provided between the LSI circuits 721 and the wireless-interface module 722. The serial-channel switch 723 switches between the LSI circuits 721 that are connected in parallel to the serial-channel switch 723 so that the LSI circuits 721 supporting the serial communications are accessed in sequence.

According to the above-described configurations, software debugging, boundary verification, and so forth can be performed for a plurality of LSI circuits in a non-contact manner.

It should be understood by those skilled in the art that various modifications, combinations, sub-combinations and alterations may occur, without being limited to the above-described embodiments, depending on design requirements and other factors insofar as they are within the scope of the appended claims or the equivalents thereof.

For example, according to the above-described embodiments, the LSI circuits are used, as a target semiconductor device. However, according to another embodiment, various types of semiconductor devices with pre-installed programs may be used, as the target semiconductor device. The various types of semiconductor devices require various tests or the like.

Further, according to another embodiment, various wireless-communication systems using wireless waves and/or light beams can be used, without being limited to the wireless-communication systems used in the above-described embodiments. Further, according to another embodiment, various types of interfaces can be used, without being limited to the above-described interfaces supporting the JTAG system and/or other general-purpose serial interfaces.

Further, according to another embodiment, the mounting configuration of the wireless-interface module may be changed in various ways, without being limited to the above-described embodiments where the wireless-interface modules are directly mounted on the above-described semiconductor device and/or the package thereof, or the substrate. Namely, the wireless-interface module may be added to the semiconductor device and/or the package thereof in various ways, for example, externally or internally.

The uses of the above-described wireless-interface modules are not limited. For example, when a target device substrate is incorporated in the commodity cabinet, it becomes possible to update the software of an internal circuit and/or the hardware of a programmable-logic-device (PLD)-integrated device via the wireless-interface module according to an embodiment. The above-described function can be used, so as to update the software and/or the PLD hardware of a television (TV) set, a mobile audio device, a mobile phone, and so forth. The above-descried function allows for repairing a commodity and/or updating the software and/or hardware of the commodity without opening the commodity cabinet when the commodity is recovered on the market. Subsequently, a significant reduction in the market-repair cost can be expected.

When a new media format such as video and/or audio reproduction is added to various devices, added hardware such as a coder/decoder (CODEC) and software can be easily updated.

Further, since the wireless-interface module is internally provided, data (use-amount data, log data, charge data, and so forth) recorded in a power meter, a gas meter, a sensor device, and so forth can be wirelessly retrieved so that the operation cost can be reduced. That is to say, the recorded data can be instantaneously retrieved and known analog meters, a known internal printer, known printing paper, and so forth become unnecessary. Further, the efficiency of operations can be significantly improved.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A wireless-interface module comprising:
a connection unit provided at a semiconductor-device side, the connection unit connected to a plurality of standardized connection-terminal units of a plurality of semiconductor devices, each of the semiconductor devices having a function of performing internal processing on the basis of a predetermined signal input from the standardized connection-terminal unit;
a wireless signal-transmission-and-reception unit on the semiconductor-device side that transmits and/or receives a wireless signal to and/or from a wireless-interface module provided on a host-device side, the wireless-interface module provided on a host-device side including a communication module and a transmission-and-reception control unit that is connected to a processor via a buffer, the processor performing code conversions according to instructions transmitted from a host device provided on the host-device side, wherein the host device makes the semiconductor devices execute internal processing; and
a control unit provided at the semiconductor-device side that controls an operation performed by the wireless signal-transmission-and-reception unit and that converts a signal transmitted and/or received between the connection unit and the wireless signal-transmission-and-reception unit,
the control unit including a serial channel switch for switching the signal between each of the standardized connection terminal units.

2. The wireless-interface module according to claim 1, wherein the standardized connection-terminal unit supports a Joint-Test-Action-Group standard.

3. The wireless-interface module according to claim 1, wherein the standardized connection-terminal unit supports a general purpose serial-interface standard.

4. The wireless-interface module according to claim 1, wherein the wireless signal-transmission-and-reception unit performs a wireless communication under a back-scatter system.

5. The wireless-interface module according to claim 1, wherein the wireless signal-transmission-and-reception unit performs an infrared communication.

6. The electronic apparatus according to claim 1, wherein the internal processing is performed, so as to rewrite information stored in the memory of the semiconductor device.

7. The wireless-interface module according to claim 1, wherein the wireless-interface module provided on the semiconductor-device side includes a reflected-wave-communication module, a transmission buffer, a transmission-packet-generation unit, a data buffer, a command buffer, a receptiondata-analysis unit, a wireless-protocol-control unit, a reception buffer, a data-analysis unit, a data buffer, and a command buffer.

8. The wireless-interface module according to claim 7,
wherein the transmission-packet-generation unit is configured to receive data transmitted from the data buffer and the command buffer, and to generate a wireless-transmission packet,
wherein the command buffer is configured to store a JTAG command, and
wherein the data buffer is configured to store data associated with the JTAG command.

9. The wireless-interface module according to claim 8, wherein the data-analysis unit is configured to analyze JTAG commands transmitted from the semiconductor-device side per an instruction, to separate the JTAG commands into data and a command unit, and to store the data and the command unit in each of the data buffer and the command buffer.

10. The wireless-interface module according to claim 9, wherein the wireless-protocol-control unit is configured to access the transmission module, the transmission buffer, and the reception buffer, and to perform wireless communications between the wireless-protocol-control unit and the host-device side.

11. The wireless-interface module according to claim 10,
wherein the reception buffer is configured to store a wireless-reception packet transmitted from the reflected-wave-communication module, and
wherein the data-analysis unit is configured to generate a JTAG command by analyzing the wireless-reception packet received by the reception buffer, and is configured to store the JTAG command and data associated with the JTAG command in the data buffer and the command buffer.

12. The wireless-interface module according to claim 11, wherein the transmission-and-reception control unit includes a JTAG-protocol-control unit, and is configured to store the JTAG command transmitted from the data-analysis unit, to acquire the JTAG command from the data stored in the data buffer and the command buffer, and to transmit the JTAG command to a target-LSI-circuit side.

13. A wireless-interface module comprising:
a connection unit provided on a host-device side, the connection unit connected to a standardized connection-terminal unit of a host device that uses a predetermined signal output from the connection-terminal unit so that internal processing of a plurality of semiconductor devices is performed, each of the semiconductor devices provided on a semiconductor-device side;
a wireless signal-transmission-and-reception unit on the host-device side that transmits and/or receives a wireless signal to and/or from a wireless-interface module provided on the semiconductor-device side; and
a control unit connected to a processor via a buffer, the control unit controls an operation performed by the wireless signal-transmission-and-reception unit and that converts a signal transmitted and/or received between the connection unit and the wireless signal-transmission-and-reception unit,
wherein a serial channel switch provided on the semiconductor device side switches the signal transmitted and/or received to and/or from the wireless-interface module provided on the semi-conductor-device side between each of the plurality of semiconductor devices.

14. The wireless-interface module according to claim 13, wherein the standardized connection-terminal unit supports a Joint-Test-Action-Group standard.

15. The wireless-interface module according to claim 13, wherein the standardized connection-terminal unit supports a general purpose serial-interface standard.

16. The wireless-interface module according to claim 13, wherein the wireless signal-transmission-and-reception unit performs a wireless communication under a back-scatter system.

17. The wireless-interface module according to claim 13, wherein the wireless signal-transmission-and-reception unit performs an infrared communication.

18. The electronic apparatus according to claim 13, wherein the internal processing is performed, so as to rewrite information stored in the memory of the semiconductor device.

19. An electronic apparatus comprising:
a plurality of semiconductor devices each having a function of performing internal processing on the basis of a predetermined signal input from a standardized connection-terminal unit, each of the semiconductors provided on a semiconductor-device side;
a wireless-interface module provided on the semiconductor-device side, the wireless-interface module interfacing between a wireless-interface module provided on a host-device side, the wireless-interface module provided on the host-device side including a communication module and a transmission-and-reception control unit that is connected to a processor via a buffer, the processor performing code conversions according to instructions transmitted from a host device;
a host device provided on the host-device side, the host device making each of the semiconductor devices perform the internal processing, wherein the wireless-interface module includes a plurality of connection units connected to the standardized connection-terminal unit of each of the semiconductor devices;
a wireless signal-transmission-and-reception unit provided on the semiconductor-device side that transmits and/or receives a wireless signal to and/or from the wireless-interface module provided on the host-device side; and
a control unit that controls an operation performed by the wireless signal-transmission-and-reception unit and that converts a signal transmitted and/or received between the connection unit and the wireless signal-transmission-and-reception unit,
the control unit including a serial channel switch for switching the signal between the standardized connection-terminal unit of each of the semiconductor devices.

20. The electronic apparatus according to claim 19, wherein the standardized connection-terminal unit supports a Joint-Test-Action-Group standard.

21. The electronic apparatus according to claim 19, wherein the standardized connection-terminal unit supports a general purpose serial-interface standard.

22. The electronic apparatus according to claim 19, wherein the wireless signal-transmission-and-reception unit performs a wireless communication under a back-scatter system.

23. The electronic apparatus according to claim 19, wherein the wireless signal-transmission-and-reception unit performs an infrared communication.

24. The electronic apparatus according to claim 19, wherein the internal processing is performed, so as to internally test the semiconductor device.

25. The electronic apparatus according to claim 19, wherein the internal processing is performed to read information stored in the semiconductor device.

26. The electronic apparatus according to claim 19, wherein the internal processing is performed, so as to rewrite information recorded in the semiconductor device.

27. An electronic apparatus comprising:
a host device that uses a predetermined signal output from a standardized connection-terminal unit so that internal processing of a plurality of semiconductor devices is performed, the host device provided on a host-device side; and
a wireless-interface module provided on the host-device side, the wireless-interface module provided on the host-device side interfacing between a wireless-interface module provided on a semiconductor-device side and the host device,
wherein the wireless-interface module provided on the host-device side includes a connection unit connected to the standardized connection-terminal unit of the host device;
a wireless signal-transmission-and-reception unit provided on the host-device side that transmits and/or receives a wireless signal to and/or from the wireless-interface module provided on the semiconductor-device side, the wireless-interface module provided on a host-device side including a communication module and a transmission-and-reception control unit that is connected to a processor via a buffer, the processor performing code conversions according to instructions transmitted from a host device; and
a control unit that controls an operation performed by the wireless signal-transmission-and-reception unit and that converts a signal transmitted and/or received between the connection unit and the wireless signal-transmission-and-reception unit,
wherein a serial channel switch provided on the semiconductor device side switches the signal transmitted and/or received to and/or from the wireless-interface module provided on the semi-conductor-device side between each of the plurality of semiconductor devices.

28. The electronic apparatus according to claim 27, wherein the standardized connection-terminal unit supports a Joint-Test-Action-Group standard.

29. The electronic apparatus according to claim 27, wherein the standardized connection-terminal unit supports a general purpose serial-interface standard.

30. The electronic apparatus according to claim 27, wherein the wireless signal-transmission-and-reception unit performs a wireless communication under a back-scatter system.

31. The electronic apparatus according to claim 27, wherein the wireless signal-transmission-and-reception unit performs an infrared communication.

32. The electronic apparatus according to claim 27, wherein the internal processing is performed, so as to internally test the semiconductor device.

33. The electronic apparatus according to claim 27, wherein the internal processing is performed to read information stored in the semiconductor device.

34. The electronic apparatus according to claim 27, wherein the internal processing is performed, so as to rewrite information stored in the semiconductor device.

* * * * *